US009641312B1

(12) United States Patent
Fischer

(10) Patent No.: US 9,641,312 B1
(45) Date of Patent: May 2, 2017

(54) METHOD FOR SYMBOL CLOCK RECOVERY IN PULSE POSITION MODULATION (PPM) SYSTEMS

(71) Applicant: NORTHROP GRUMMAN SYSTEMS CORPORATION, Falls Church, VA (US)

(72) Inventor: Gerald R. Fischer, Luray, VA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/172,617

(22) Filed: Jun. 3, 2016

(51) Int. Cl.
H04L 7/00 (2006.01)
H04L 25/49 (2006.01)
H04L 7/033 (2006.01)
H04L 7/10 (2006.01)
H03K 9/04 (2006.01)
H04L 7/04 (2006.01)

(52) U.S. Cl.
CPC .......... *H04L 7/0016* (2013.01); *H04L 7/0079* (2013.01); *H03K 9/04* (2013.01); *H04L 7/0331* (2013.01); *H04L 7/0334* (2013.01); *H04L 7/046* (2013.01); *H04L 7/10* (2013.01); *H04L 25/4902* (2013.01)

(58) Field of Classification Search
CPC . H04L 25/4902; H04L 7/0331; H04L 7/0334; H04L 7/046; H04L 7/10; H04L 7/0016; H03K 9/04
See application file for complete search history.

(56) References Cited

U.S. PATENT DOCUMENTS

| 4,866,738 | A | | 9/1989 | Wiesmann et al. | |
|---|---|---|---|---|---|
| 5,206,909 | A | | 4/1993 | Gates | |
| 5,541,955 | A | | 7/1996 | Jacobsmeyer | |
| 5,977,822 | A | * | 11/1999 | Rybicki | H03K 7/04 329/311 |
| 6,066,982 | A | * | 5/2000 | Ohtani | H03K 9/04 329/313 |
| 7,221,215 | B2 | | 5/2007 | Shimazaki et al. | |
| 7,289,560 | B2 | | 10/2007 | Huat | |
| 7,414,463 | B2 | | 8/2008 | Akahori et al. | |
| 7,539,245 | B2 | | 5/2009 | Venna et al. | |
| 8,218,670 | B2 | | 7/2012 | Abou Rjeily | |
| 8,488,714 | B2 | | 7/2013 | Wu et al. | |
| 8,594,175 | B2 | | 11/2013 | Lee et al. | |
| 2009/0232197 | A1 | | 9/2009 | Mimura et al. | |

* cited by examiner

*Primary Examiner* — Janice Tieu
(74) *Attorney, Agent, or Firm* — John A. Miller; Miller IP Group, PLC

(57) ABSTRACT

A symbol clock recovery circuit for recovering a symbol clock in an M-ary pulse position modulation (PPM) signal. The recovery circuit includes a largest magnitude comparison circuit that selects a largest magnitude signal value from a group of M signal values aligned with a hypothesis symbol boundary location and the average of that largest magnitude value is compared with a threshold, or with results from other boundary location hypotheses, or with both, to determine the true position of the symbol boundary.

19 Claims, 4 Drawing Sheets

METHOD FOR SYMBOL CLOCK RECOVERY IN PULSE POSITION MODULATION (PPM) SYSTEMS

BACKGROUND

Field

This invention relates generally to a system and method for recovering a symbol clock in a receiver that receives an M-ary pulse position modulation (PPM) signal and, more particularly, to a system and method for recovering a symbol clock in a receiver that receives an M-ary PPM signal, where the method includes comparing a largest magnitude pulse value of groups of pulse values in the PPM signal at consecutive time slots to determine whether the symbol clock identifies the beginning of a symbol group, and if not, changing the symbol clock.

Discussion

Data and communications messages sent between various devices and systems, such as cellular signals, satellite uplink and downlink signals, satellite cross-link signals, etc., are modulated onto a carrier wave at various modulation frequencies. Sometimes these signals are optical signals where light beams are modulated to signify data. These modulated signals often employ a slot clock to regulate the location of individual time slots where changes in the signal can be transmitted. Various techniques are known in the art for effectively recovering the slot clock in the receiver.

M-ary pulse position modulation (PPM) is a form of signal modulation where N message bits (N is equal to the base 2 logarithm of M) are encoded on the signal by transmitting a single signal pulse in one of M possible time-slots. Each signal pulse in the modulated signal is located in any one time slot of a group of M time slots, where the group of M time slots is referred to as a symbol. As the signal is constructed and transmitted, consecutive symbol groups in the signal typically follow each other without gaps therebetween. Therefore, when the signal is received in the receiver, the demodulation technique also needs to produce a symbol clock that identifies the first time slot in each symbol group. However, because the last time slot in one symbol group is adjacent to the first time slot in the next symbol group it is generally difficult to identify where one symbol group ends and the next symbol group begins. More specifically, identifying the boundary between symbol groups from the pulses that are in the symbol groups is difficult because the pulses may be very close to each other or may be far apart, such as being located in the last time slot in one symbol group and being located in the first time slot in the next symbol group or being located in the first time slot in one symbol group and being located in the last time slot in the next symbol group. For example, if the modulation scheme employs 4-ary PPM (M is equal to 4), the signal pulse for any one symbol group can be placed in any one of four time slots in that group, where any of the next four time slots can include the pulse for the next symbol group.

Identification of the true location of the boundary between symbols is a necessary first step to correctly deduce the data bits being indicated by the signal. Confident and rapid identification of this boundary provides benefits to the user in the form of reduced data latency and increased channel efficiency. Although trial and error strategies can be devised that employ examination of recovered data bits for the presence of known patterns (such as frame sync patterns) to indicate successful symbol boundary alignment, it would be clear to those skilled in the art that these strategies increase the time to determine the proper alignment, which increases data latency, and usually discard otherwise useful signal information associated with unsuccessful trials, and thus decrease channel efficiency, and also depend on fixed patterns that carry no data and therefore decrease channel efficiency.

DETAILED DESCRIPTION OF THE EMBODIMENTS

The following discussion of the embodiments of the invention directed to a symbol clock recovery circuit for an M-ary PPM signal is merely exemplary in nature, and is in no way intended to limit the invention or its applications or uses.

Figure 1:
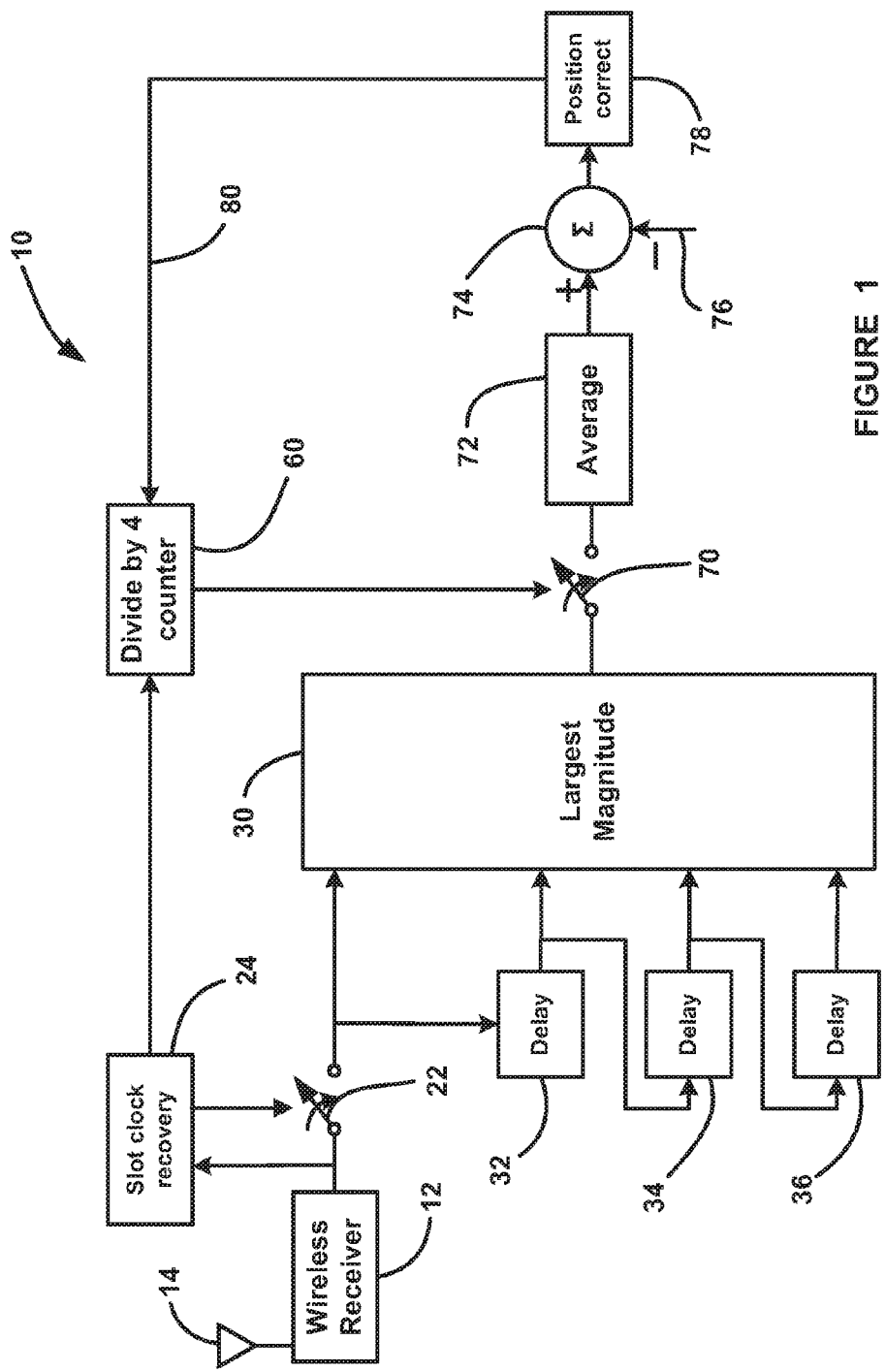
FIG. 1 is a block diagram of a symbol clock recovery circuit including a single largest magnitude select circuit.

FIG. 1 is a schematic block diagram of a symbol clock recovery circuit 10 including a receiver 12 that receives an RF signal at a particular frequency from a suitable antenna 14, where the receiver 12 can be any receiver suitable for the purposes described herein. In this non-limiting embodiment, the receiver 12 is a wireless receiver, however, this is for discussion purposes only in that the receiver 12 can be a wired receiver that receives an electrical signal on a suitable cable (not shown), the receiver 12 can be an optical receiver that receives an optical signal on an optical fiber (not shown), the receiver 12 can be an optical receiver that receives an optical signal in free space through a suitable optical device (telescope), etc.

Figure 2:
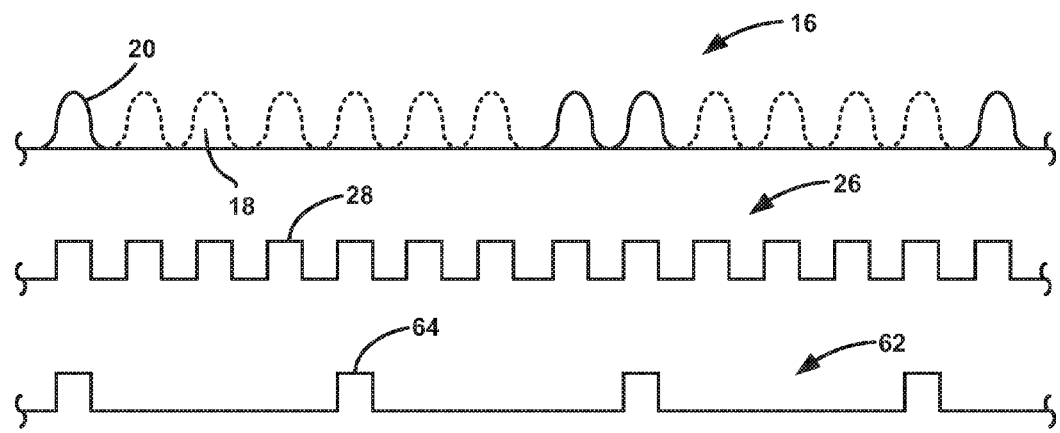
FIG. 2 is a timing diagram showing a received 4-ary PPM signal, a slot clock and a symbol clock.

The receiver 12 demodulates the received signal shown as, for example, a 4-ary PPM sinusoidal signal 16 in FIG. 2, and sends it to a pulse sampler 22 and a slot clock recovery circuit 24. Although the discussion herein includes demodulating a 4-ary PPM signal, it would be clear to those skilled in the art that the symbol clock recovery circuit 10 is applicable for any suitable M-ary PPM signal. It is also noted that that the sampler 22 is provided for a full digital implementation of the recovery circuit. As will be appreciated by those skilled in the art, for other embodiments that may employ analog elements, the sampler 22 may optionally be eliminated. It is further noted that digital implementation of the recovery circuit, or portions of the recovery circuit, may be accomplished either with hardware digital circuits or with software. In this regard, the term "circuit" as used throughout this disclosure may also be used to refer to algorithms in software, where appropriate processors would be employed. The signal 16 includes time slots 18 that may or may not include a signal pulse 20, where those time slots 18 that do not include a signal pulse 20 are illustrated by dotted lines. Each signal pulse 20 would be located in one of a group of four of the time slots 18, where each group represents a symbol, but it is not initially known where one symbol group ends and the next symbol group begins. The slot clock recovery circuit 24 produces a slot clock signal 26, such as shown in FIG. 2, that includes a slot clock pulse 28 for each time slot 18 in the signal 16. The slot clock signal 26 controls the pulse sampler 22 so that it meters out a sample energy value for each time slot 18 in the signal 16, which may or may not include the energy from a pulse 20.

The sample values are provided directly to a largest magnitude select circuit 30 and to a first delay circuit 32, such as a shift register, that delays the sample value one time slot 18, which is also provided to the circuit 30. That delayed sample value is also delayed one time slot 18 by a second delay circuit 34, which is also provided to the circuit 30. The twice delayed sample value is also delayed one time slot 18 by a third delay circuit 36, which is also provided to the circuit 30. Thus, the select circuit 30 receives the information or energy in the current time slot 18, and the three previous time slots 18, which may or may not be one complete symbol group, and which may include no pulses 20, one pulse 20 or two pulses 20. As is apparent, the select circuit 30 receives the most recent four sample values because there are four time slots 18 in each symbol group for the 4-ary PPM signal 16, where the number of delay devices would be M−1 for an M-ary PPM signal. In other words, for those symbol clock recovery circuits employing a larger number of time slots 18 in each symbol group, the select circuit 30 would receive that number of sample values.

Figure 3:
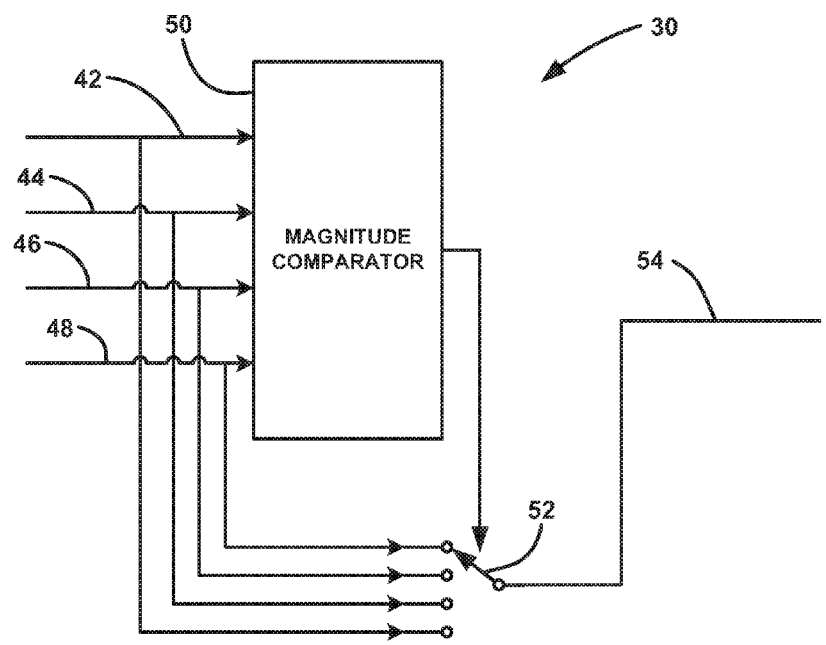
FIG. 3 is a block diagram of the select circuit shown in FIG. 1.

The select circuit 30 determines which of the four consecutive sample values has the largest magnitude energy value, and outputs that value, which initially may or may not be a pulse energy value. FIG. 3 is a block diagram of the select circuit 30 that receives the sample values from the sampler 22 and the delay circuits 32, 34 and 36 on lines 42, 44, 46 and 48, respectively. It is noted that the select circuit 30 shown in FIG. 3 is by way of example in that other circuits may be equally applicable that are able to determine a largest magnitude sample value. The sample values are provided to a magnitude comparator 50 and to a selector switch 52. The magnitude comparator 50 compares the energy or amplitude of each of the sample values provided on the lines 42-48 to determine which one is the largest, and causes the selector switch 52 to select the line 42-48 with that sample value so that for each consecutive group of four of the time slots 18 the sample value in the signal 16 having the highest magnitude is output from the select circuit 30 on line 54. Thus, every time a new sample value is obtained, the history of the sample values that is provided to the circuit 30 is shifted one sample time forward and a new largest sample value is obtained at the output of the circuit 30.

The slot clock signal 26 provided by the slot clock recovery circuit 24 is sent to a divide-by-4 counter 60 that selects every fourth slot clock pulse 28 and outputs a signal including those pulses as a presumptive symbol clock, such as symbol clock signal 62 including pulses 64 shown in FIG. 2, where the counter 60 divides the slot clock signal by M for an M-ary PPM signal. The particular pulses 64 in the symbol clock signal 62 relative to particular time slots 18 are initially at an arbitrary location within the symbol group. That arbitrary start point of the symbol clock signal 62 is assumed to be the start location of each symbol group, but that is not initially known with certainty.

The symbol clock signal 62 from the counter 60 controls a largest magnitude sampler 70 that receives the largest magnitude sample value from the circuit 30 at each time slot 18, where the sampler 70 only outputs the current highest magnitude sample value each time it receives a symbol clock pulse 64. The sample values from the sampler 70 are provided to an averaging circuit 72 that averages all of the sample values received over a predetermined time period in order to reduce the effects of noise on the channel, where the number of average samples is determined by the desired confidence of the symbol clock recovery decision. However, it is noted that the longer it takes to average the sample values, the longer it takes to accurately obtain the proper location of the clock pulses 64 at the beginning of each symbol group, and during that time data is being passed through the channel that can't be immediately used. Although it is possible and desirable in some situations to employ signal sample retention strategies (storage in digital memory) that allow for the transmitted data to be recovered well after the symbol clock alignment decision has been made, it would be apparent to those skilled in the art that more rapid availability of an accurate symbol clock alignment decision will minimize the amount of memory required for such strategies and reduce latency in availability of the data.

The averaged sample values from the averaging circuit 72 are sent to a summation junction 74 that subtracts a predetermined threshold value therefrom provided on line 76, and if that difference is greater than zero as determined by a position correct circuit 78, meaning the averaged sample value is greater than the threshold value, then the current position of the symbol clock pulses 64 is correct and indicates the beginning time slot 18 for each symbol group. However, if the averaged sample value is not greater than the threshold value, then the current position of the symbol clock pulses 64 is incorrect and does not indicate the beginning time slot 18 for each symbol group. In this situation, a divider control signal is sent on line 80 to the counter 60 to move the position of the symbol clock pulse 64 to a next time slot 18 so that the output of the sampler 70 is at a different time. In other words, if the output of the sampler 70 does not have a great enough magnitude to indicate that the position of the symbol clock pulses 64 is correct, the position of the symbol clock pulses 64 is changed in an attempt to identify the proper location for the beginning of the symbol group, and once the sample amplitude exceeds the threshold value in the summation junction 74, the circuit 10 will know it has the correct position of the symbol clock pulses 64. Thus, the symbol clock recovery process may need to operate over four of the time slots 18 after the averaging process in a worst case scenario to identify the correct position of the symbol clock pulses 64 for a 4-ary PPM signal. In an alternate embodiment, it may be possible to remove the summation junction 74, and compare each sample value in four consecutive time slots 18 to identify the position with the largest amplitude as the correct symbol clock pulse position.

The reason that the circuit 10 is able to identify the proper location of the symbol clock pulses 64 in this manner is because it is guaranteed that only a single pulse 20 having high energy will occur in each properly located symbol group. If the position of the symbol clock pulses 64 is not at the beginning of the symbol group, then there may be no pulses 20 or there may be two pulses 20 in the group of the time slots 18 being compared in the circuit 30. In the case of two pulses the value included in the averaging circuit 72 is similar to the case of one pulse, but in the case of no pulses the value included in the averaging circuit 72 is significantly lower than one high energy pulse. Thus, the resulting value from the averaging circuit 72 is influenced to be significantly lower if the symbol clock is not in the correct position (that position which always provides one and only one high energy pulse for inclusion in the average). It will be apparent to those skilled in the art that the optimum choice of the decision threshold in this embodiment is dependent on the amplitude of the signal pulses 20, the channel noise and any offset in the samples provided by the sampler 22.

In an alternate embodiment, which greatly reduces the influence of any offset in the samples provided by the sampler 24, the symbol clock recovery circuit can be modified from the basic design shown by the circuit 10 to include a comparison of the largest magnitude of the sample values of four of the time slots 18 from a contiguous group of four slots, referred to as an on-time hypothesis magnitude, and the largest magnitude of the sample values of four of the time slots 18 from a contiguous group of four slots that is shifted by one slot time from the on-time group, referred to as an off-time hypothesis comparison, to determine if the on-time hypothesis symbol clock position is correct, or whether it needs to be changed.

Figure 4:
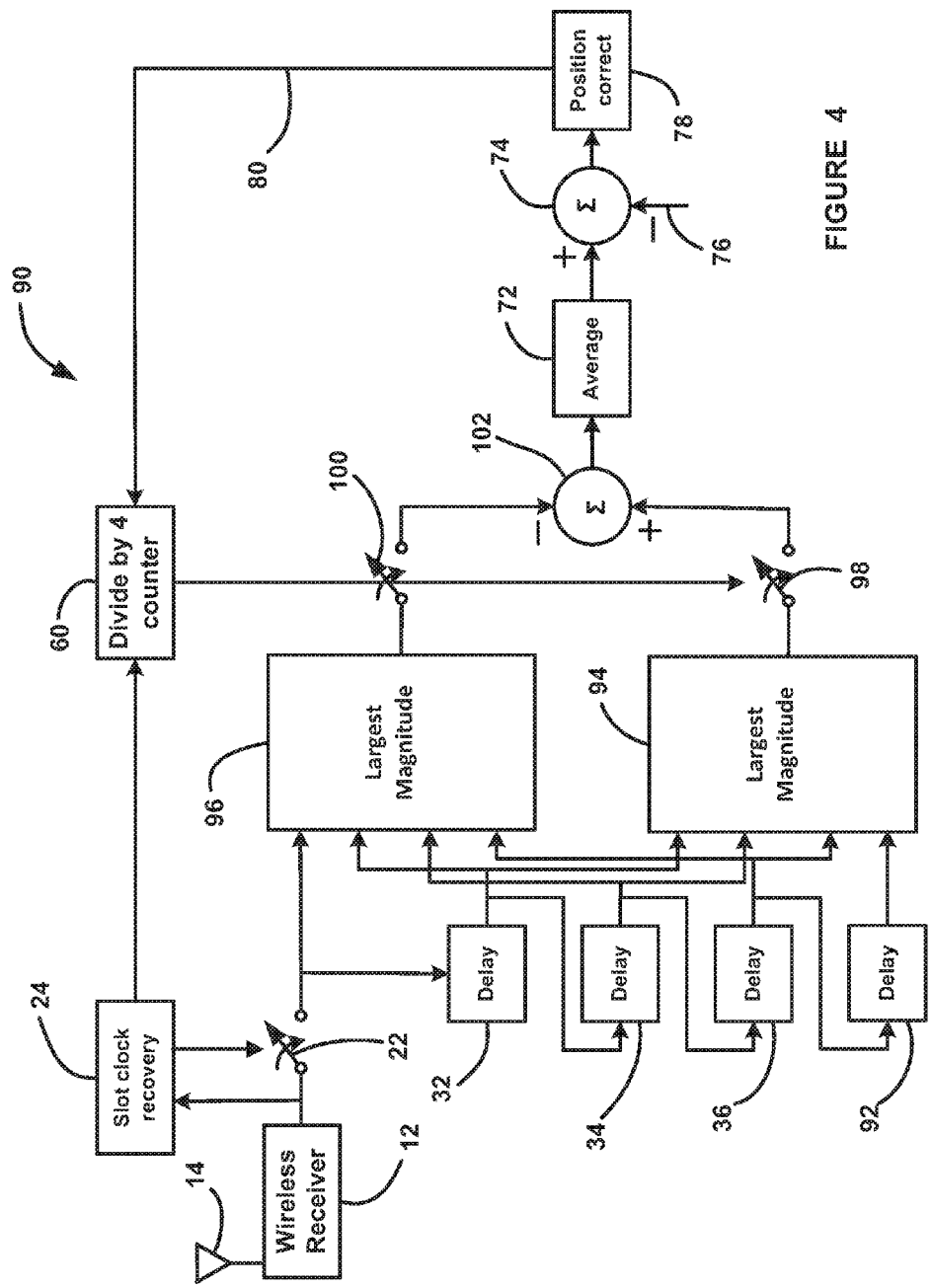
FIG. 4 is a block diagram of a symbol clock recovery circuit including two largest magnitude select circuits.

This embodiment is illustrated as symbol clock recovery circuit 90 shown in FIG. 4, where like elements to the circuit 10 are identified by the same reference number. In the circuit 90, a fourth delay circuit 92 is provided that delays the sample value one time slot 18 from the delay circuit 36, where the number of delay devices would be M for an M-ary PPM signal in this embodiment. Further, the select circuit 30 is replaced with an on-time select circuit 94 and an off-time select circuit 96 that each operate in the same manner as the circuit 30. The on-time select circuit 94 receives the sample values from the delay circuits 32, 34, 36 and 92 and is presumed to have the correct location of the symbol clock pulse 64 at the beginning of the symbol group, although that may not be known yet. The off-time select circuit 96 receives the current sample value from the sampler 22 and the delayed sample values from the delay circuits 32, 34 and 36 and is presumed to not have the correct location of the symbol clock pulse 64 at the beginning of the symbol group, although that may not be known yet either.

The largest magnitude sample value from the on-time select circuit 94 is provided to a largest magnitude sampler 98 and the largest magnitude sample value from the off-time select circuit 96 is provided to a largest magnitude sampler 100 in the same manner as discussed above for the circuit 30. For each symbol clock pulse 64 from the counter 60 sent to the samplers 98 and 100 the largest magnitude sample value from the sampler 100 is subtracted from the largest magnitude sample value from the sampler 98 in a summation junction 102 and the difference of those two sample values is provided to the averaging circuit 72.

If the sample value from the circuit 94 is greater than the sample value from the circuit 96 and the output of the summation junction 102 is positive, this is an indication that the symbol clock pulses 64 may be at the first time slot 18 in the symbol group. The average of these values from the averaging circuit 72 is compared to the threshold value in the summation junction 74, and if it exceeds the threshold value, the symbol clock pulses 64 are at the beginning of the symbol groups. If, however, the symbol clock pulses 64 do not identify the first time slot 18 in the symbol group, then the magnitude of the sample value from the select circuit 94 will not be larger, or will not be significantly larger, than the sample value of the output of the select circuit 96, and the output of the summation junction 102 will not be positive, or will not be significantly positive, and the average of those values will not be greater than the threshold value in the summation junction 74, where the position correct circuit 78 will adjust the position of the symbol clock pulses 64 as discussed above. The values provided by the circuits 94 and 96 both contain any offset in the samples provided by sampler 22. The subtraction of one from the other at the output of the junction 102 renders the symbol clock recovery circuit 90 insensitive to any offset in the samples provided by the sampler 22.

Figure 5:
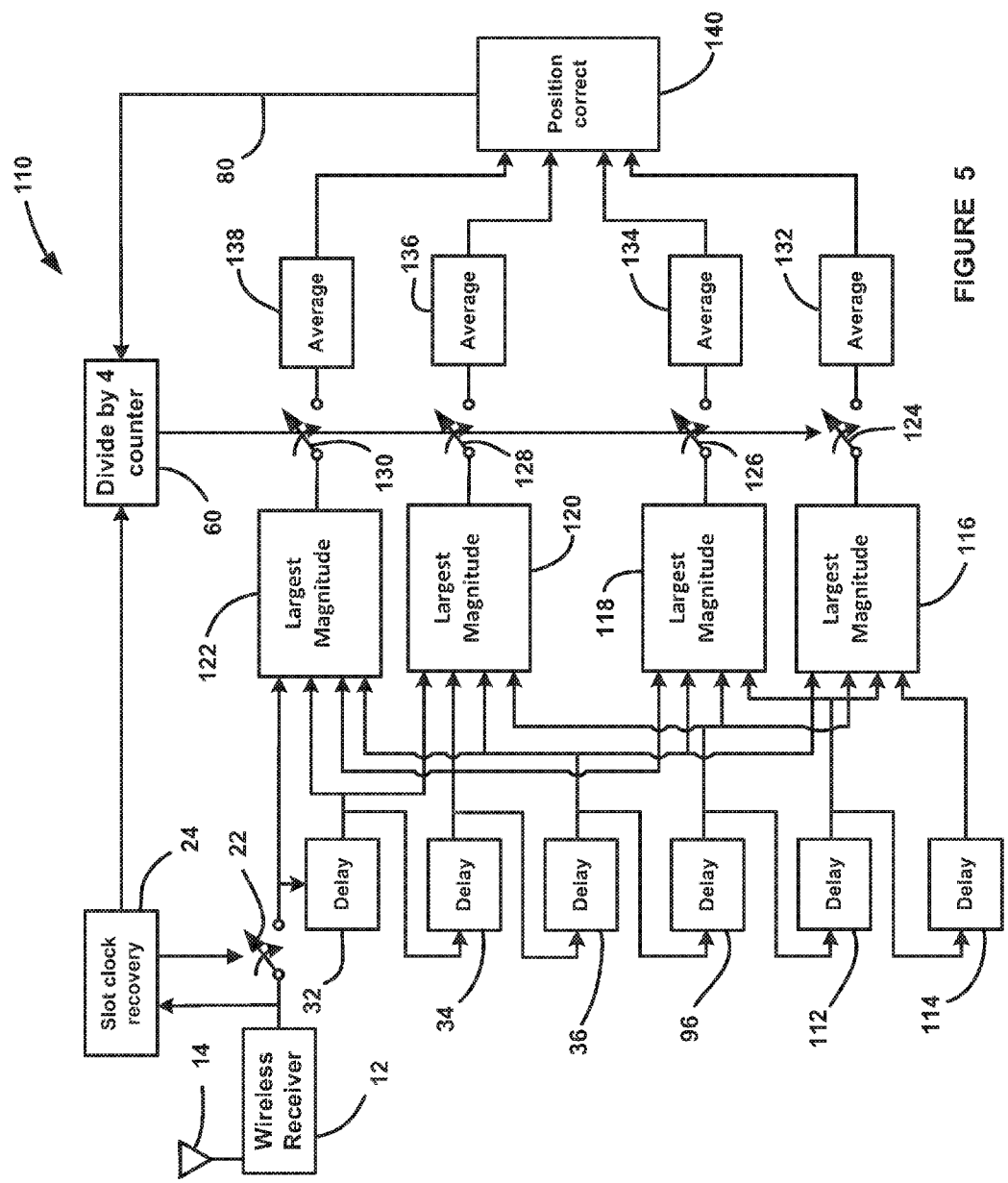
FIG. 5 is a block diagram of a symbol clock recovery circuit including multiple largest magnitude select circuits.

In yet another embodiment, it is possible to sample all of the possible positions of the symbol clock pulses 64 for each symbol group at the same time to provide fast acquisition of the proper symbol clock pulse location and insensitivity to both signal offset and signal amplitude uncertainty. This embodiment is illustrated as symbol clock recovery circuit 110 shown in FIG. 5, where like elements to the circuit 90 are shown by the same reference number. The circuit 110 includes two additional delay circuits 112 and 114, four select circuits 116, 118, 120 and 122 that operate in the same manner as the circuit 30, four largest magnitude samplers 124, 126, 128 and 130 that receive the outputs of the circuits 116, 118, 120 and 122, respectively, and four averaging circuits 132, 134, 136 and 138 that receive the outputs from the samplers 124, 126, 128 and 130, respectively, where the number of delay devices is 2M-2 and the number of the select circuits is M for an M-ary PPM signal in this embodiment. Particularly, the select circuit 116 receives the oldest group of four sample values from the delay circuits 36, 92, 112 and 114, the select circuit 118 receives the previous oldest group of four sample values from the delay devices 34, 36, 92 and 112, the select circuit 120 receives the previous oldest group of four sample values from the delay devices 32, 34, 36 and 92, and the select circuit 122 receives the current sample value from the sampler 22 and the last three sample values from the delay devices 32, 34 and 36. Each of the four sample values in each of the select circuits 116, 118, 120 and 122 are output every symbol clock pulse 64 through the samplers 124, 126, 128 and 130, respectively, in the same manner as discussed above, and these sample values are averaged in averaging circuits 132, 134, 136 and 138, respectively, also in the same manner as discussed above. The averaged sample values from each of the averaging circuits 132-138 are provided to a position correct circuit 140 that identifies which of the averaged sample values has the largest magnitude and sends a control signal on the control line 80 to the counter 60 to set the position of the symbol clock pulses 64 for that magnitude.

This symbol clock alignment decision is available without time consuming sequential testing of hypotheses and therefore maximizes the user benefits of low latency and high channel efficiency at the cost of the extra delay devices, magnitude comparators and averaging circuits. The values provided by the averaging circuits 132, 134, 136 and 138 each contain any offset in the samples provided by the sampler 22 and each contain any uncertainty in average signal amplitude. The relative comparison of each with the others in the position correct circuit 140 renders the symbol clock recovery circuit 110 insensitive to both signal offset and signal amplitude uncertainty. Although it may be possible to devise alternative circuits in the receiver 12 to control signal amplitude (AGC) or signal offset, it will be apparent to those skilled in the art that they may be more burdensome than the use of this embodiment. It will also be apparent that the benefits of insensitivity to signal offset and signal amplitude uncertainty of the symbol clock recovery circuit 110 can be obtained from the simpler symbol clock recovery circuit 10 by sequentially testing all symbol boundary hypotheses, storing the result from each symbol boundary hypothesis, and then comparing the results from all the hypotheses against each other to form the symbol boundary decision.

It will be apparent to those skilled in the art that the processing burden of the symbol clock recovery circuits discussed above can be reduced by reducing the quantization of the pulse amplitude in each time slot of the hypothetical symbol groups of the incoming signal. This is sometimes referred to as "soft decision" quantization and can give a beneficial compromise of processing efficiency verses confidence in the symbol clock boundary alignment decision for a given signal-to-noise ratio and averaging time. It will also be apparent to those skilled in the art that the processing burden can be further reduced by making hard decisions regarding the presence or absence of a pulse amplitude in each time slot of the hypothetical symbol groups of the incoming signal by comparison of the received amplitude of the pulse with a threshold. An incorrect symbol boundary location hypothesis can be rejected immediately upon discovery of either two or zero pulses in the symbol group if the signal-to-noise ratio is sufficiently high to give acceptable confidence in this decision, or, in the manner previously described, averages can be formed over many symbol groups to indicate the proper hypothesis with greater confidence for a given signal-to-noise ratio. More specifically, the average number of occasions of the incorrect conditions of two pulses or zero pulses found within a symbol, or alternatively the average number of occasions of the correct condition of a single pulse within a symbol, can be determined over many symbols and the symbol boundary hypothesis can be retained or discarded by comparison of the average with a threshold or by comparison of the average with the average results from alternate hypothesis.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A symbol clock recovery circuit for recovering a symbol clock in an M-ary pulse position modulation (PPM) signal, said PPM signal including symbol groups defined by consecutive M number of time slots, said symbol clock recovery circuit comprising:
    a slot clock recovery circuit that provides a slot clock pulse for each time slot in the PPM signal;
    a pulse sampler circuit receiving the PPM signal and being controlled by the slot clock pulses to selectively provide sample values for each time slot in the PPM signal;
    at least M−1 number of sequentially organized delay circuits that each delay the sample values one time slot to provide at least M−1 number of increasingly delayed sample values;
    at least one largest magnitude select circuit responsive to the sample values from the pulse sampler circuit and the delay circuits and outputting a largest magnitude sample value for each symbol group of M time slots;
    a divider circuit responsive to the slot clock pulses from the slot clock recovery circuit and generating a symbol clock signal having a single symbol clock pulse for every M number of time slots;
    at least one largest magnitude sampler circuit responsive to the largest magnitude sample values from at least one largest magnitude select circuit for each time slot and selectively providing that largest magnitude sample value every symbol clock pulse; and
    a position correct circuit responsive to the largest magnitude sample values from at least one largest magnitude sampler circuit and providing a control signal to the divider circuit to correct a position of the symbol clock pulses to identify a first time slot in each symbol group.

2. The symbol clock recovery circuit according to claim 1 further comprising at least one averaging circuit that is responsive to the largest magnitude sample values from at least one largest magnitude sampler circuit and that averages the lamest magnitude sample values over a predetermined time period and provides the averaged sample values to the position correct circuit.

3. The symbol clock recovery circuit according to claim 1 further comprising a threshold comparator that compares the largest magnitude sample values from at least one largest magnitude sampler circuit to a predetermined threshold value before the position correct circuit, where the position correct circuit corrects the position of the symbol clock pulses if the threshold value exceeds the largest magnitude sample value.

4. The symbol clock recovery circuit according to claim 3 wherein the largest magnitude select circuit is a first largest magnitude select circuit and a second largest magnitude select circuit and the number of delay circuits is M number of delay circuits, wherein the first magnitude select circuit receives the sample values from the M delay circuits and the second magnitude select circuit receives the sample values from the pulse sampler circuit and M−1 delay circuits.

5. The symbol clock recovery circuit according to claim 4 wherein the at least one largest magnitude sampler circuit is a first largest magnitude sampler circuit and a second largest magnitude sampler circuit where the first largest magnitude sampler circuit receives the largest magnitude sample values from the first magnitude select circuit and the second largest magnitude sampler circuit receives the largest magnitude sample values from the second magnitude select circuit, said symbol clock recovery circuit further comprising a summation junction that subtracts the largest magnitude sample values from the second largest magnitude sampler circuit from the largest magnitude sample values from the first largest magnitude sampler circuit, wherein the difference between the largest magnitude sample values from the summation junction is provided to the threshold comparator.

6. The symbol clock recovery circuit according to claim 5 further comprising an averaging circuit that is responsive to the difference between the largest magnitude sample values from the summation junction and that averages the difference between the largest magnitude sample values over a predetermined time period and provides the averaged difference between the largest magnitude sample values to the threshold comparator.

7. The symbol clock recovery circuit according to claim 1 wherein the number of delay circuits is 2M-2 number of delay circuits and the plurality of largest magnitude select circuits is M number of largest magnitude select circuits, and wherein each largest magnitude select circuit receives a different group of M number of contiguous sample values, where the groups are shifted-by one time slot relative to the next group.

8. The symbol clock recovery circuit according to claim 7 wherein the at least one largest magnitude sampler circuit is M number of largest magnitude sampler circuits, wherein the largest magnitude sample value from all of the largest magnitude sampler circuits are compared in the position correct circuit.

9. The symbol clock recovery circuit according to claim 8 further comprising M number of averaging circuits each being responsive to the largest magnitude sample value from one of the largest magnitude sampler circuits and that averages the largest magnitude sample value over a predetermined time period and provides the averaged largest magnitude sample value to the position correct circuit.

10. A symbol clock symbol clock recovery circuit for recovering a symbol clock in an M-ary pulse position modulation (PPM) signal received by a receiver, said PPM signal including symbol groups defined by consecutive M number time slots, said symbol clock recovery circuit comprising:
- a slot clock recovery circuit that provides a slot clock pulse for each time slot in the PPM signal;
- a pulse sampler circuit receiving the PPM signal and being controlled by the slot clock pulses to selectively provide sample values for each time slot in the PPM signal;
- M number of sequentially organized delay circuits that each delay the sample values one time slot to provide M number of increasingly delayed sample values;
- a first largest magnitude select circuit responsive to the delayed sample values from the M number of delay circuits and a second largest magnitude select circuit responsive to the sample value from the pulse sampler circuit and M−1 delay circuits, said first and second largest magnitude select circuit each outputting a largest magnitude sample value for each time slot;
- a divider circuit responsive to the slot clock pulses from the slot clock recovery circuit and generating a symbol clock signal including symbol clock pulses for every M number of time slots;
- a first largest magnitude sampler circuit responsive to the largest magnitude sample values from the first largest magnitude select circuit and a second largest magnitude sampler circuit responsive to the largest magnitude sample values from the second largest magnitude select circuit, said first largest magnitude sampler circuit and said second largest magnitude sampler circuit receiving the symbol clock signal and outputting the first and second largest magnitude sample values every symbol clock pulse;
- a summation junction that subtracts the first largest magnitude sample values from the first largest magnitude sampler circuit from the second largest magnitude sample values from the second largest magnitude sampler circuit and provides a difference largest magnitude sample value;
- an averaging circuit that is responsive to the difference between the sample values from the summation junction and that averages the difference between the largest magnitude sample values over a predetermined time period;
- a threshold comparator that compares the averaged difference sample values from the averaging circuit to a predetermined threshold value; and
- a position correct circuit responsive to a difference signal from the threshold comparator and providing a control signal to the divider circuit to correct the position of the symbol clock pulses if the difference signal does not exceed the threshold value.

11. The symbol clock recovery circuit according to claim 10 wherein the receiver is selected from the group consisting of a wireless receiver, a wired receiver and an optical receiver.

12. A symbol clock recovery circuit for recovering a symbol clock in an M-ary pulse position modulation (PPM) signal received by a receiver, said PPM signal including symbol groups defined by consecutive M number of time slots, said symbol clock recovery circuit comprising:
- a slot clock recovery circuit that provides a slot clock pulse for each time slot in the PPM signal;
- a pulse sampler circuit receiving the PPM signal and being controlled by the slot clock pulses to selectively provide sample values for each time slot in the PPM signal;
- M−1 number of sequentially organized delay circuits that each delay the sample values one time slot to provide M−1 number of increasingly delayed sample values;
- a magnitude select circuit responsive to the sample values from the pulse sampler circuit and the delay circuits and outputting a largest magnitude sample value for each time slot;
- a divider circuit responsive to the slot clock pulses from the slot clock recovery circuit and generating a symbol clock signal including a symbol clock pulse for every M number of time slots;
- a largest magnitude sampler circuit responsive to the largest magnitude sample values from the largest magnitude select circuit for each time slot and selectively providing that sample value every symbol clock pulse;
- an averaging circuit that is responsive to the largest magnitude sample values from the largest magnitude sampler circuit and that averages the largest magnitude sample values over a predetermined time period
- a threshold comparator that compares the averaged largest magnitude sample values from the largest magnitude select circuit to a predetermined threshold value; and
- a position correct circuit responsive to a comparison signal from the threshold comparator and providing a control signal to the divider circuit to correct a position of the symbol clock pulses to identify a first time slot in each symbol group.

13. The symbol clock recovery circuit according to claim 12 wherein the receiver is selected from the group consisting of a wireless receiver, a wired receiver and an optical receiver.

14. A symbol clock recovery circuit for recovering a symbol clock in an M-ary pulse position modulation (PPM) signal, said PPM signal including groups defined by consecutive M number of time slots, said symbol clock recovery circuit comprising:
- a slot clock recovery circuit that provides a slot clock pulse for each time slot in the PPM signal;
- at least M−1 number of delay circuits that consecutively delay signal values in each time slot for one time slot;
- at least one largest magnitude select circuit responsive to the signal values from the delay circuits and outputting a largest magnitude signal value for each group of M time slots;
- a divider circuit responsive to the slot clock pulses from the slot clock recovery circuit and generating a symbol clock signal having a single symbol clock pulse for every M number of time slots;
- at least one largest magnitude circuit responsive to the largest magnitude signal values from at least one largest magnitude select circuit for each time slot and selectively providing that signal value every symbol clock pulse;
- at least one averaging circuit that is responsive to the largest magnitude signal values from at least one largest magnitude circuit and that averages the largest magnitude signal values over a predetermined time period; and a position correct circuit responsive to the averaged signal values from at least one averaging circuit and providing a control signal to the divider circuit to correct a position of the symbol clock pulses to identify a first time slot in each group.

15. The symbol clock recovery circuit according to claim 14 further comprising a threshold comparator that compares the largest magnitude signal values from at least one largest magnitude circuit to a predetermined threshold value before the position correct circuit, where the position correct circuit corrects the position of the symbol clock pulses if the threshold value exceeds the largest magnitude signal value.

16. A method for recovering a symbol clock in an M-ary pulse position modulation (PPM) signal, said PPM signal including groups defined by consecutive M number of time slots, said method comprising:
   recovering a slot clock pulse for each time slot in the PPM signal;
   delaying a signal value in each time slot for one time slot at least M−1 number of times;
   providing a largest magnitude signal value from the delayed signal values for each group of M time slots;
   generating a symbol clock signal having a single symbol clock pulse for every M number of time slots;
   selectively providing the largest signal value every symbol clock pulse; and
   correcting the position of the symbol clock pulses to identify a first time slot in each group in response to the selected largest magnitude signal value.

17. The method according to claim 16 further comprising averaging largest magnitude signal values over a predetermined time period, and wherein correcting the position of the symbol clock pulses uses the averaged largest magnitude signal values.

18. The method according to claim 16 further comprising comparing the largest magnitude signal value to a predetermined threshold value before correcting the position of the symbol clock pulses, where correcting the position of the symbol clock pulses occurs if the threshold value exceeds the largest magnitude signal value.

19. The method according to claim 16 further comprising sampling the PPM signal to selectively provide signal values for each time slot in the PPM signal using the slot clock pulses.

* * * * *